US008347020B2

(12) United States Patent
Maddali et al.

(10) Patent No.: US 8,347,020 B2
(45) Date of Patent: Jan. 1, 2013

(54) MEMORY ACCESS CONTROLLER, SYSTEMS, AND METHODS FOR OPTIMIZING MEMORY ACCESS TIMES

(75) Inventors: Srinivas Maddali, San Diego, CA (US); Deepti Sriramagiri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 533 days.

(21) Appl. No.: 12/407,910

(22) Filed: Mar. 20, 2009

(65) Prior Publication Data

US 2010/0241782 A1    Sep. 23, 2010

(51) Int. Cl.
*G06F 12/00* (2006.01)
(52) U.S. Cl. ............ 711/5; 711/105; 711/154; 711/156; 711/157
(58) Field of Classification Search .............. 711/5, 105, 711/154, 156–157
See application file for complete search history.

(56) References Cited

U.S. PATENT DOCUMENTS

| 6,052,134 A | 4/2000 | Foster |
| 6,212,598 B1 | 4/2001 | Jeddeloh |
| 2002/0053001 A1 | 5/2002 | Miura et al. |
| 2003/0126354 A1 | 7/2003 | Kahn et al. |
| 2004/0193787 A1* | 9/2004 | Takizawa ...................... 711/105 |
| 2008/0183977 A1 | 7/2008 | Gower et al. |
| 2009/0055570 A1 | 2/2009 | Madrid et al. |
| 2009/0319718 A1* | 12/2009 | Aldworth et al. ................. 711/5 |

OTHER PUBLICATIONS

International Search Report and Written Opinion—PCT/US2010/027981, International Search Authority—European Patent Office—Nov. 8, 2010.
Supplementary European Search Report—EP10754172—Search Authority—The Hague—Mar. 29, 2012.

* cited by examiner

*Primary Examiner* — Jasmine Song
(74) *Attorney, Agent, or Firm* — Sam Talpalatsky; Nicholas J. Pauley; Jonathan T. Velasco

(57) ABSTRACT

A configurable memory access controller and related systems and methods. In embodiments described herein, the configurable memory controller is adapted to provide a separate memory access configuration for each of a plurality of memory banks in a given memory system. The memory access configuration provided for each memory bank can either be to leave open or close at least one memory page in each memory bank. In this manner, a memory access configuration can be provided for each memory bank on an individualized basis to optimize memory access times based on the type of data activity in each memory bank. In embodiments described herein, the memory controller can also be configured to allow for dynamic configuration of one or more memory banks. Dynamic configuration involves changing or overriding the memory access configuration for a particular memory bank to optimize memory access times.

34 Claims, 14 Drawing Sheets

| BANK | PAGE | PAGE CLOSED CONFIG. | PAGE LEFT OPEN CONFIG. | ACCESS TIME GAIN |
|---|---|---|---|---|
| 1. B1 | 0 | 6 CYCLES | 6 CYCLES | 0 CYCLES |
| 2. B1 | 1 | 6 CYCLES | 9 CYCLES | -3 CYCLES |
| 3. B1 | 4 | 6 CYCLES | 9 CYCLES | -3 CYCLES |
| 4. B1 | 4 | 6 CYCLES | 3 CYCLES | +3 CYCLES |
| 5. B1 | 9 | 6 CYCLES | 9 CYCLES | -3 CYCLES |
| 6. B1 | 8 | 6 CYCLES | 9 CYCLES | -3 CYCLES |
| 7. B1 | 1 | 6 CYCLES | 9 CYCLES | -3 CYCLES |
| 8. B1 | 2 | 6 CYCLES | 9 CYCLES | -3 CYCLES |
| 9. B1 | 2 | 6 CYCLES | 3 CYCLES | +3 CYCLES |
|  |  | 54 CYCLES | 66 CYCLES | -12 CYCLES |

MEMORY ACCESS CONTROLLER, SYSTEMS, AND METHODS FOR OPTIMIZING MEMORY ACCESS TIMES

BACKGROUND

I. Field of the Disclosure

The technology of the present application relates generally to a memory access controller and related systems and methods for optimizing memory access times in a processor-based system.

II. Background

It is common for processor-based systems, including central processing unit (CPU) based systems, to use dynamic memory for system memory. Dynamic memory is less expensive than static memory, because only one transistor is typically required per memory bit in dynamic memory as opposed to multiple transistors typically required per bit of static memory. However, use of dynamic memory has a tradeoff. Dynamic memory access times are typically longer than static memory access times. Accessing dynamic memory involves two discrete tasks, both of which require processing time. First, the memory page (i.e. row) corresponding to the desired memory location in a memory bank to be accessed is opened. This is also known as a "row select," referring to a two-dimensional row and column memory arrangement. Second, the desired memory location within the memory page is accessed. This is also known as a "column select." Increased memory access times incurred by use of dynamic memory can impact CPU performance both in terms of reduced bandwidth and number of instructions executed in a given time (e.g. million instructions per second (MIPS)).

To mitigate increased memory access times when employing dynamic memory in processor-based systems, memory controllers can be configured to keep or leave a memory page within a given memory bank open after an access to the memory page. Keeping or leaving a memory page open after an access in a memory bank can improve memory access time performance if contiguous memory accesses are to the same memory page. Processing time is not required to close the memory page and reopen it for subsequent accesses. However, a tradeoff exists by keeping or leaving a memory page open in a memory bank after an access. If, for example, a CPU wants to access data from a different memory page in the same memory bank, three tasks, as opposed to two tasks, must be performed. First, the currently open memory page must be closed in the memory bank. Next, the new memory page containing the desired memory location to be accessed must be opened. Then, the desired memory location within the memory page is accessed. The additional processing time incurred in closing a previously accessed memory page before a new memory page can be opened results in reduced bandwidth and reduces MIPS for the CPU.

Configuring a memory controller to keep or leave a memory page open after an access may be ideal for certain memory applications, particularly those that involve accessing contiguous memory locations, such as video, graphics, and display memory applications, and other applications, as examples. In these scenarios, memory page closes occur less often, because contiguous memory accesses are to the same memory page in a given memory bank. However, configuring a memory controller to keep or leave a memory page open after a memory access may not be ideal for other memory access applications, such as cache enabled CPU accesses for example. This is because it is unlikely that contiguous memory accesses will be to the same memory page in a given memory bank. Thus, memory access time will be increased due to the increased processing time involved in closing a previously accessed memory page before a new memory page can be opened.

SUMMARY OF THE DISCLOSURE

Embodiments disclosed in detailed description include a memory access controller and related systems and methods. The memory controller is configurable to provide a separate memory access configuration for each of a plurality of memory banks in a given memory system. The memory access configuration provided for each memory bank can be to either keep or leave open or close at least one memory page in each memory bank after a memory access. In this manner, a memory access configuration can provided for each memory bank on an individualized basis to optimize memory access times based on the type of data stored in each memory bank. For example, if a memory bank is configured to store data that often involves contiguous memory accesses to memory locations in the same memory page, the memory bank can be configured to leave its memory pages open after each access. A memory access time savings will be realized since a memory page will not have to be reopened between contiguous accesses to the same memory page. However, if a memory bank often involves contiguous memory accesses to memory locations in different memory pages, that memory bank can be configured to close its memory pages after each access. In this manner, a memory access time penalty is not incurred by having to first close a prior accessed memory page to perform a memory access to a different memory page in the same memory bank.

In embodiments of the detailed description, a static or dynamic configuration can be provided for each memory bank. Static configuration involves providing a memory access configuration for a memory bank to either keep or leave its memory pages opened or close them after each access. A static configuration may be provided for memory banks during initialization or startup. The static configuration can be left in place during run-time without alteration. The memory controller can be configured to allow for dynamic configuration of the memory banks during run-time. Dynamic configuration involves changing the memory access configuration for a particular memory bank to further optimize memory access times. Dynamic configuration can involve either a temporary override or a permanent change (at least until a next permanent configuration change) of a memory access configuration. A temporary override of a memory access configuration will automatically result in the configuration returning to the previous static memory access configuration.

Dynamic memory access configuration can be performed based on review of future pending memory accesses to a given memory page, or a prediction of whether future memory accesses to a given memory bank will likely be to the same memory page or not. In this instance, depending on the review or prediction, further memory access time savings may be realized by dynamically changing the memory access configuration for a given memory bank.

BRIEF DESCRIPTION OF THE FIGURES

FIG. 3 is a table diagram illustrating exemplary memory page accesses in a given memory bank, whereby a memory access time penalty is realized when a leave memory page open configuration is provided for the memory bank;

DETAILED DESCRIPTION

Figure 1:
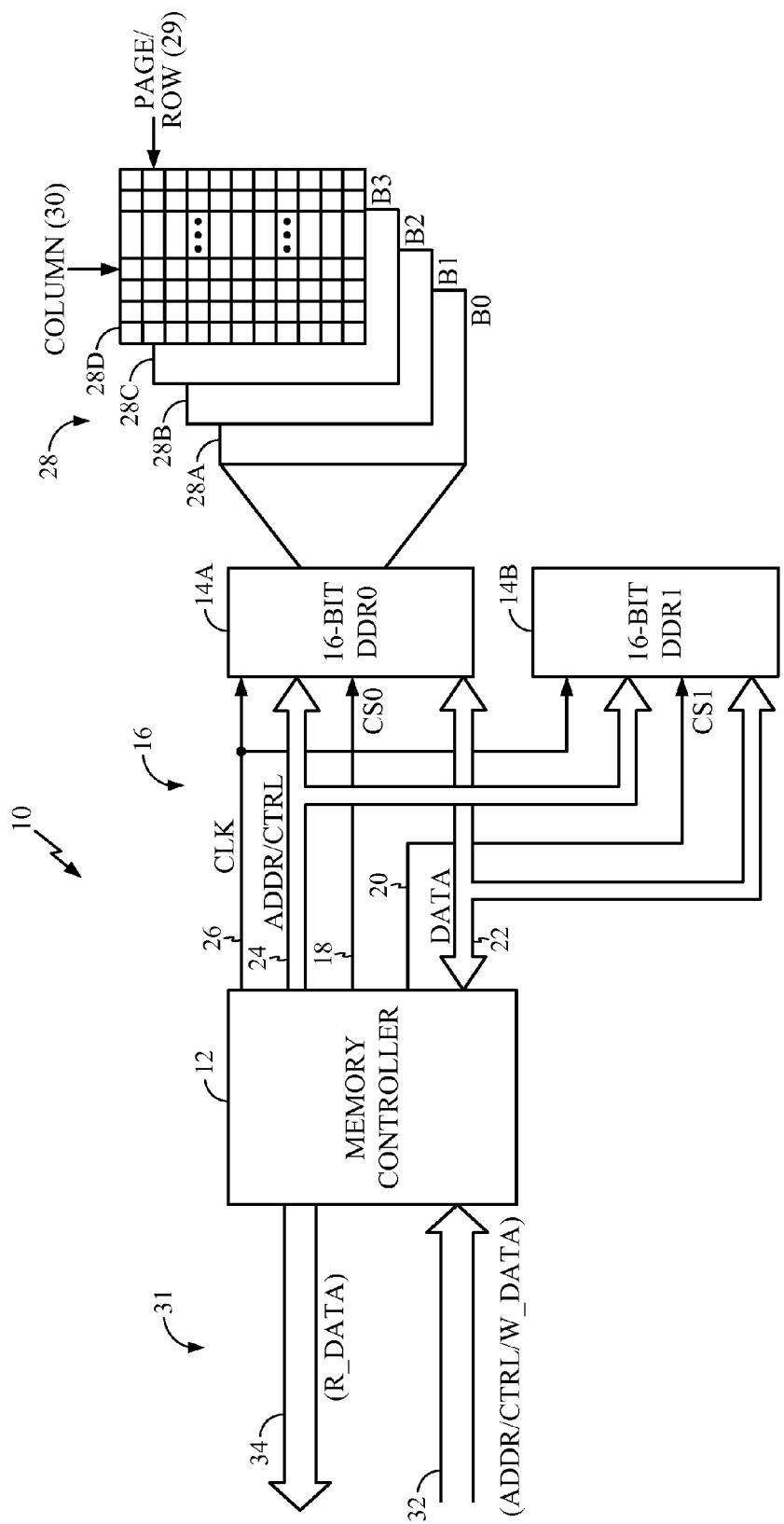
FIG. 1 is a diagram of an exemplary configurable memory controller and associated memory as part of an exemplary processor-based system.

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in detailed description include a memory access controller and related systems and methods. The memory controller is configurable to provide a separate memory access configuration for each of a plurality of memory banks in a given memory system. The memory access configuration provided for each memory bank can be to either keep or leave open or close at least one memory page in each memory bank after a memory access. In this manner, a memory access configuration can provided for each memory bank on an individualized basis to optimize memory access times based on the type of data stored in each memory bank. For example, if a memory bank is configured to store data that often involves contiguous memory accesses to memory locations in the same memory page, the memory bank can be configured to leave its memory pages open after each access. A memory access time savings will be realized since a memory page will not have to be reopened between contiguous accesses to the same memory page. However, if a memory bank often involves contiguous memory accesses to memory locations in different memory pages, that memory bank can be configured to close its memory pages after each access. In this manner, a memory access time penalty is not incurred by having to first close a prior accessed memory page to perform a memory access to a different memory page in the same memory bank.

FIG. 1 illustrates an exemplary memory system 10. The memory system 10 employs a configurable memory controller 12 configured to provide a separate memory access configuration for each memory bank in the memory system 10. The memory controller 12 is responsible for the flow of data going to and from memory 14. In the illustrated example, the memory controller 12 is responsible for controlling the flow of data to and from two dynamic memory chips 14A, 14B. In this example, each memory chip 14A, 14B is a 16-bit double data rate (DDR) dynamic random access memory (DRAM) chip, labeled DDR0 and DDR1. In this regard, the memory controller 12 used to drive two DDR DRAM memory chips 14A, 14B may be a DDR memory controller. DDR memory controllers may be more complicated than Single Data Rate (SDR) memory controllers, but they allow for twice the data to be transferred without increasing the clock rate or bus width to the memory cell. However, the memory chips 14A, 14B may be any type of dynamic memory. Examples include SDRAM, DDR, DDR2, DDR3, MDDR (Mobile DDR), LPDDR and LPDDR2. The memory controller 12 may be any type of memory controller compatible with its memory chips. Further, the memory controller 12 as illustrated may be provided on a motherboard or other printed circuit board (PCB) as a separate device, or integrated on at least one CPU or semiconductor die, which may reduce memory latency.

The memory controller 12 controls the flow of data to and from the memory chips 14A, 14B via a memory bus 16. In this example, the memory bus 16 includes two chip selects (CS0, CS1) 18, 20; one for each memory chip 14A, 14B. The chip selects 18, 20 are selectively enabled by the memory controller 12 to enable the memory chip 14A, 14B containing the desired memory location to be accessed. The memory controller 12 only enables one of the memory chips 14A, 14B at a time so that only one DDR DRAM memory chip 14A, 14B asserts data on a data bus (DATA) 22 at one time to avoid data collisions. The memory bus 16 also includes an address/control bus (ADDR/CTRL) 24 that allows the memory controller 12 to control the memory address accessed in the memory chips 14A, 14B for either writing or reading data to or from memory 14. The memory bus 16 also includes a clock signal (CLK) 26 to synchronize timing between the memory controller 12 and the memory chips 14A, 14B for memory accesses. In this example, data is transferred on the rising and falling access of the clock signal (CLK) 26 of the memory system 10 for DDR DRAM memory chip 14A, 14B.

Each DDR DRAM memory chip 14A, 14B contains a plurality of memory banks, referred to generally as element 28. A memory bank is a logical unit of memory, the size of which is determined by the CPU of a system. In the illustrated example of FIG. 1, the DDR memory chips 14A, 14B are 16-bit, which means they are designed for use with a 16-bit CPU, requiring the memory banks 28 to provide 16 bits of information at one time. In the illustrated example, each DDR DRAM memory chip 14A, 14B contains four memory banks. Only the four memory banks (B0, B1, B2, and B3) 28A, 28B, 28C, 28D for DDR DRAM memory chip (DDR0) 14A are illustrated in FIG. 1; however, the DDR DRAM memory chip (DDR1) 14B also contains similar memory banks and memory pages. Thus a memory bank and memory page are referred to herein generally for each DDR DRAM memory chip 14A, 14B as elements 28 and 29, respectively.

Each memory bank 28 is organized into a grid-like pattern, with "rows" and "columns." The data stored in the DDR DRAM memory chips 14A, 14B comes in blocks, defined by the coordinates of the row and column of the specific information. Each row is known as a memory page 29. In order to access memory 14 in the DDR DRAM memory chips 14A, 14B, the memory controller 12 asserts a chip select (CS0 or CS1) 18, 20, and issues a memory page open command that activates a certain memory page 29 as indicated by the address on the ADDR/CTRL bus 22. This command typically takes a few clock cycles. After the desired memory page 29 is opened, a column address 30, as either a "read" or "write," is issued by the memory controller 12 to access the data in the desired memory location. When an access is requested to another memory page 29 in the memory bank 28, the memory controller 12 has to deactivate or close the currently activated memory page 29, which typically takes a few clock cycles. Hence, memory access to the data in the memory chips 14A, 14B normally involves opening the memory page 29 containing the desired memory location for writing or reading data, and then closing the memory page 29 after the memory access is completed. In this manner, a different memory page 29 can subsequently be accessed by the memory controller 12.

If contiguous memory accesses are made to the same memory page 29 in a given memory bank 28, clock cycles could be saved if the memory page 29 was kept open after the first memory access. In this manner, the subsequent memory access to the same memory page 29 would not require reopening the memory page 29. The amount of total clock cycle savings depends on the number of contiguous memory accesses to the same memory page 29. This will be discussed by example in more detail below with regard to FIG. 5. However, if memory accesses are often made to different memory pages 29, keeping or leaving a memory page 29 open after an access can result in a clock cycle penalties. This is because before the memory page 29 of subsequent memory access can be opened, the memory controller 12 would first have to close the memory page 29 that was previously left open. The amount of clock cycle penalty depends on the number of contiguous memory accesses to different memory pages 29. This will be discussed by example in more detail below with regard to FIG. 6.

According to embodiments described herein, the memory controller 12 is configurable to provide memory access configurations for each of the memory banks 28 individually. A memory access configuration is a configuration stored in or accessible to the memory controller 12 to indicate whether memory pages 29 accessed from a particular memory bank 28 are to be left open or closed after an access. In this regard, an overall memory access time savings for the memory system 10 can be realized over memory systems 10 that do not allow for a memory access configuration for each memory bank 28. For example, the DDR DRAM memory chip 14A in the memory system 10 of FIG. 1 may be designed to store system data in its memory banks 28 that typically involve random memory accesses where contiguous memory access often does not involve accesses to memory locations in the same memory pages 29. Examples include CPU system memory, including cache accesses. In this scenario, providing a memory access configuration for the memory banks 28 of the DDR DRAM memory chip 14A to close a memory page 29 after each access will prevent memory access penalties that result from the memory controller 12 having to first close a previously accessed memory page 29 before a new memory page 29 in a given memory bank 28 can be accessed. On the other hand, the DDR DRAM memory chip 14B may be designed to store application or other types of data, such as video, graphics, or display based data, where the same memory pages 29 are often accessed contiguously. In this scenario, providing a memory access configuration for the memory banks 28 of the DDR DRAM memory chip 14B to leave its memory pages 29 open after each access will result in memory access time savings. This is because the contiguous memory accesses to the same memory page 29 will not require the memory page 29 to be opened for each access.

Note that while the preceding example provides the same memory access configuration for all memory banks 28 in a given DDR DRAM memory chip 14A, 14B, different memory access configurations can be provided for each memory bank 28 within the same DDR DRAM memory chip 14A, 14B. This is further illustrated by the memory access examples set forth in FIGS. 2 and 3.

Figure 2:
FIG. 2 is a table diagram illustrating exemplary memory page accesses in a given memory bank, whereby memory access time savings is realized when a leave memory page open configuration is provided for the memory bank.

FIGS. 2 and 3 provide further examples of memory access time savings that may be realized by the memory controller 12 being configurable to provide a memory access configuration to each memory bank 28 in the memory 14. A first memory access example 36 is illustrated in FIG. 2. As illustrated therein, a series of eight (8) memory access requests 70 are shown all to memory bank B0 (28A). The first four memory access requests are all to memory page 0. The last four memory access requests are all to memory page 1. If memory bank B0 was configured by the memory controller 12 to close a memory page after each access, each memory access would result in 6 clock cycles in this example to open and close the memory page 29 corresponding to the memory location to be accessed. However, if memory bank B0 was configured to keep or leave its memory pages 29 open after each access, each memory access would result in different memory access times depending on whether the same memory page 29 was accessed between contiguous memory access requests or not. For example, the first memory access would involve six (6) cycles: three (3) cycles to open the memory page 29 corresponding to the memory location to be accessed, and three (3) cycles to access the memory location in the opened memory page 29. However, the next three memory access requests would only take three (3) clock cycles resulting in a three (3) clock cycle access savings, because memory page 0 remains opened in memory bank B0 according to the memory access configuration.

Only when a different memory page 29 is accessed would a memory access penalty occur. As shown in memory access request number five of FIG. 2, when memory page 1 is first accessed, nine (9) clock cycles are required. This is because the memory controller 12 must close memory page 0 before it can open memory page 1. Each memory page opening requires three (3) clock cycles in this example for a total of six (6) clock cycles. The access to the memory location incurs another three (3) clock cycles for a total of nine (9) clock cycles. Thus, a three (3) clock cycle penalty results as compared to six (6) clock cycles required should a memory access configuration for memory bank B0 been provided to close a memory page 29 after each access. However, because memory page 0 is subsequently access three times in a row, a three (3) clock cycle memory access savings is realized for each access, because memory page 1 was left open. Thus, it is more advantageous in terms of memory access time in this example to provide a memory access configuration for memory bank B0 to keep its memory pages 29 open after each access since memory access requests to memory bank B0 often result in contiguous memory accesses being to the same memory page 29. To summarize the memory access example 36 in FIG. 2, a total memory access time savings of fifteen (15) clock cycles is realized by a memory access configuration being provided for memory bank B0 to keep its memory pages 29 open after each access as opposed to closing its memory pages 29 after each access.

FIG. 3 illustrates another memory access example 38, which includes a series of nine (9) memory access requests 72 to a memory bank 28 where an overall memory access penalty occurs by providing a memory access configuration to keep a memory page 29 open after each access. As illustrated, memory bank B1 is accessed nine times. Contiguous memory access requests often involve accessing different memory pages 29 within memory bank B1, as illustrated. Thus, the memory controller 12 is required to close a previously open memory page 29 more often before a new memory access can be performed, thereby resulting in nine (9) clock cycles and a three (3) clock cycle memory access penalty. However, if a memory access configuration were provided for memory bank B1 to close a memory page after each access, less overall clock cycles would be required for the nine memory access requests. Although each memory access request in this instance would incur six (6) clock cycles, and thus no memory access savings realized, memory access penalties would not be realized either. Thus in this example, it is more advantageous in terms of memory access time to provide a memory access configuration for memory bank B1 as closing a memory page after each access since memory access requests to memory bank B1 often result in contiguous memory accesses to different memory pages 29. To summarize the example in FIG. 3, a total memory access time savings of twelve (12) clock cycles is realized by a memory access configuration being provided for memory bank B1 to close its memory pages 29 after each access, as opposed to keeping its memory pages 29 open after each access.

Once the desired memory location is accessed over the memory bus 16, the memory controller 12 can provide the accessed data to a system bus 31. In the illustrated example, the system bus 31 is a different bus from the memory bus 16. However, in other systems, the memory bus 16 and the system bus 31 could be the same bus. The accessed data is provided by the memory controller 12 over the system bus 31 to another component in a processor-based system. In the illustrated example of FIG. 1, the system bus 31 includes an address/control/write data (ADDR/CTRL/W_DATA) bus 32 that receives the address of the memory location to be accessed as well as any data to be written to memory 14. A read data bus 34 (R_DATA) is also provided to carry data read from memory 14. The memory controller 12 asserts data from a read memory location in memory 14 onto the R_DATA bus 34.

Figure 4:
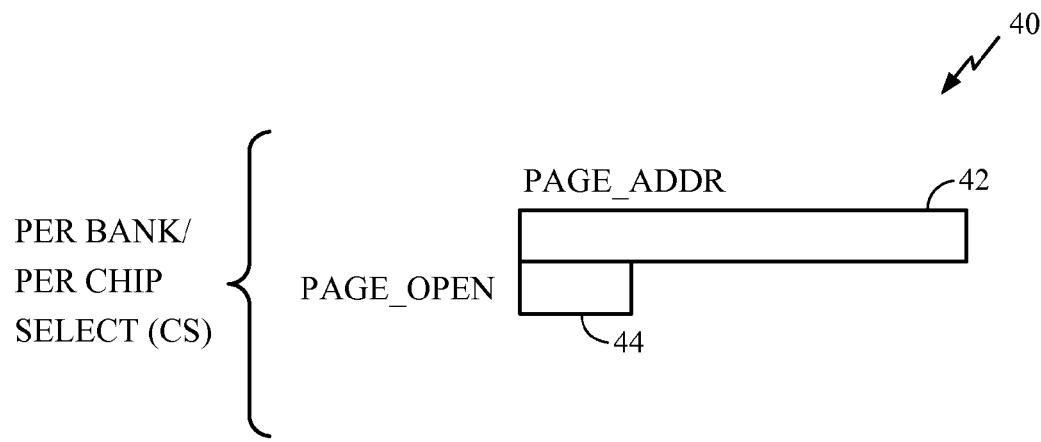
FIG. 4 is a diagram of exemplary internal registers provided in the memory controller for determining if a memory page in a memory bank is open.
Figure 5:
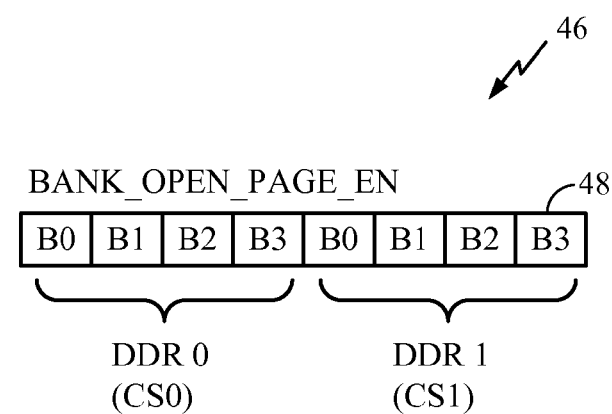
FIG. 5 is a diagram of an exemplary internal register provided in the memory controller to store a memory access configuration for each of the memory banks.

FIGS. 4 and 5 illustrate examples of internal registers that may be provided in the memory controller 12 to control memory accesses and configure a memory access configuration. Specifically, the memory access configuration is provided for each memory bank 28 to controller whether memory pages 29 therein are either left open or not after each memory access. As illustrated in FIG. 4, internal registers 40 may be provided that include a page address (PAGE_ADDR) register 42 and a page open (PAGE_OPEN) register 44. The PAGE_ADDR register 42 contains the physical address of memory pages 29 currently held in the memory 14 of the memory system 10. As is well known, the PAGE_ADDR register 42 may be employed in the memory controller 12 to avoid excessive use of an address table for certain operating systems. The PAGE_OPEN register 44 indicates whether a memory page 29 in a given memory bank 28 is open.

FIG. 5 illustrates an example of a bank open page enable (BANK_OPEN_PAGE_EN) register 46 that is internal to the memory controller 12. The BANK_OPEN_PAGE_EN register 46 is configurable to control whether each memory bank 28 keeps its memory pages 29 open or not after each memory access to the memory bank 28. In this manner and as discussed above, the memory controller 12 can provide a configuration for each memory bank 28 individually based on the design and likely use and characteristics of memory accesses to the memory banks 28. As illustrated, the BANK_OPEN_PAGE_EN register 46 is an 8-bit register in this example. This is because there are eight total memory banks 28 provided in the DDR DRAM memory chips 14A, 14B of the memory system 10 in FIG. 1. Banks B0-B3 are included in each of the DDR DRAM memory chips 14A, 14B. A memory access configuration is provided for each of the memory banks 29 in the first memory chip 14A in bit location seven (7) through (4). A memory access configuration is provided for each of the memory banks 29 in the second DDR DRAM memory chip 14B in bit locations three (3) through zero (0). A logical "1" stored in a bit in the BANK_OPEN_PAGE_EN register 46 for a given memory bank 28 indicates that memory pages 29 for that memory bank 28 are left open after each access. A logical "0" stored in a bit in the BANK_OPEN_PAGE_EN register 46 for a given memory bank 28 indicates that memory pages 29 for that memory bank 28 are closed after each access.

A memory access configuration can be provided for the DDR DRAM memory chips 14A, 14B by issuing an appropriate command to set the bits of the BANK_OPEN_PAGE_EN register 46 in the memory controller 12. The command is issued over the system bus 31 to the memory controller 12. This allows a CPU (not shown) or other processor or electronics to provide a memory access configuration for the DDR DRAM memory chips 14A, 14B. This also allows a memory access configuration to be provided by the designer of the memory system 10 by programming software that sets the bits for the BANK_OPEN_PAGE_EN register 46, as desired. The memory access configuration may be set at startup or power up, during run-time, or any other time desired. The memory access configuration may have a default setting at startup or power up. The default setting may either be to close memory pages after each access (e.g., BANK_OPEN_PAGE_EN register 46 equal or set to "00000000"), or to leave memory pages open after each access (e.g., BANK_OPEN_PAGE_EN register 46 equal or set to "11111111"). The memory access configuration may be configured as a static configuration meaning that the memory access configuration remains stored permanently in the BANK_OPEN_PAGE_EN register 46. Static control of memory access configurations and examples of memory accesses using a static memory access configuration will now be discussed.

Figure 6:
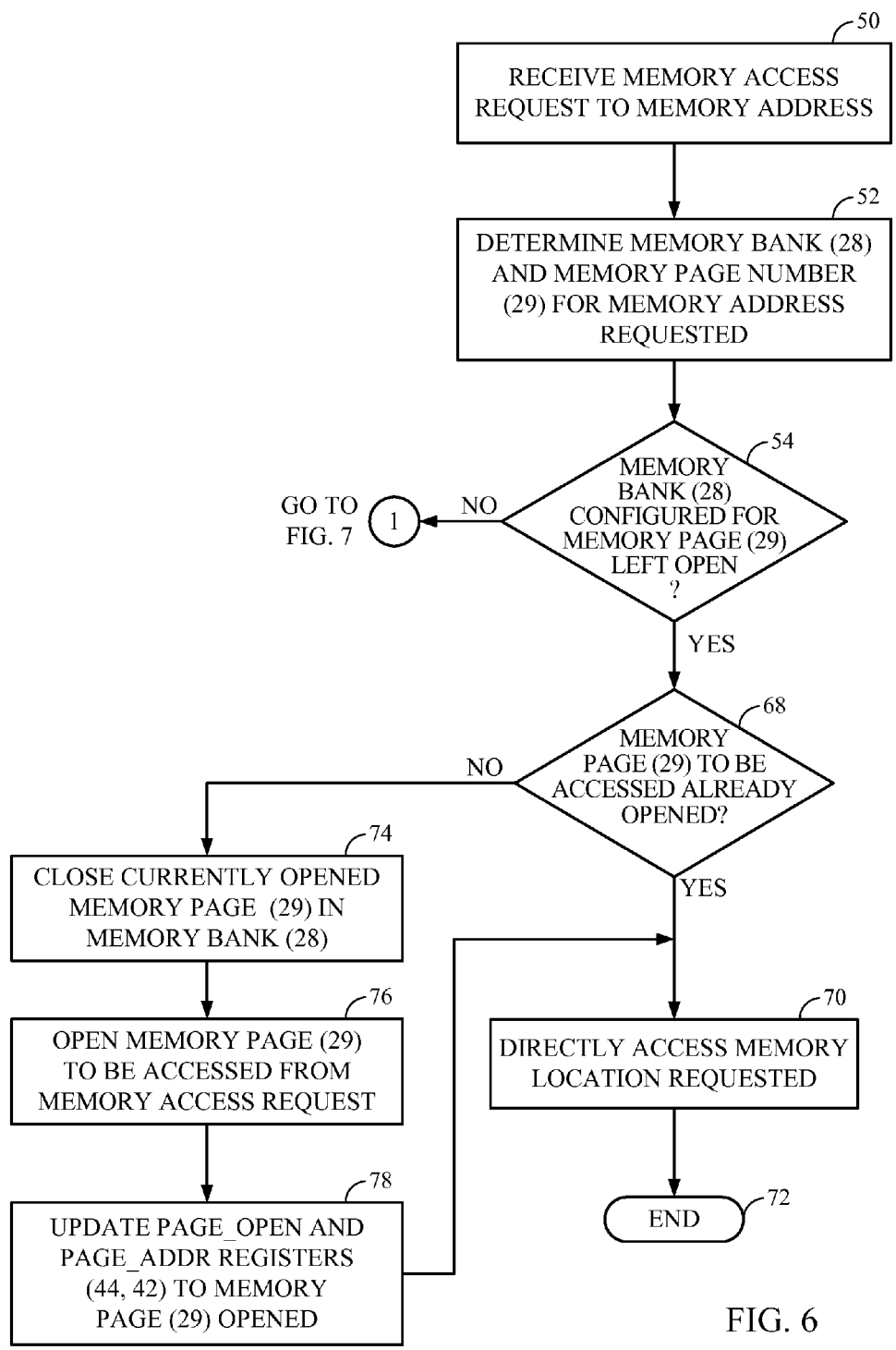
FIGS. 6 and 7 are flowcharts illustrating an exemplary process for accessing data in a memory page of a memory bank based on the memory access configuration provided in the memory controller for the memory bank.

FIG. 6 illustrates a flowchart of an exemplary memory access by the memory controller 12 to a memory page 29 in a memory bank 28 using the memory access configuration provided by the BANK_OPEN_PAGE_EN register 46. In this example, the BANK_OPEN_PAGE_EN register 46 has already been configured for each of the memory banks 28 as either leaving open or closing it memory pages 29 after each access. The memory controller 12 consults the BANK_OPEN_PAGE_EN register 46 to determine whether to leave open or close a memory page 29 in a given memory bank 28 after an access to the memory page 29. The processing may be implemented in microcode of the memory controller 12. Note that although the exemplary memory access process is provided by way of sequential tasks in a flowchart, these actions are typically performed by the memory controller 12 in a pipeline architecture to process multiple memory access requests when possible.

In this example, the process starts by the memory controller 12 first receiving a memory access request to a particular memory address within the memory 14 (block 50). The memory access request may either be a read or write request.

The memory controller 12 receives the memory address to be accessed over the system bus 31, as previously described. If the memory access request is to write data, the memory controller 12 also receives the data to be written into the received memory address of the memory 14 over the system bus 31.

Figure 7:
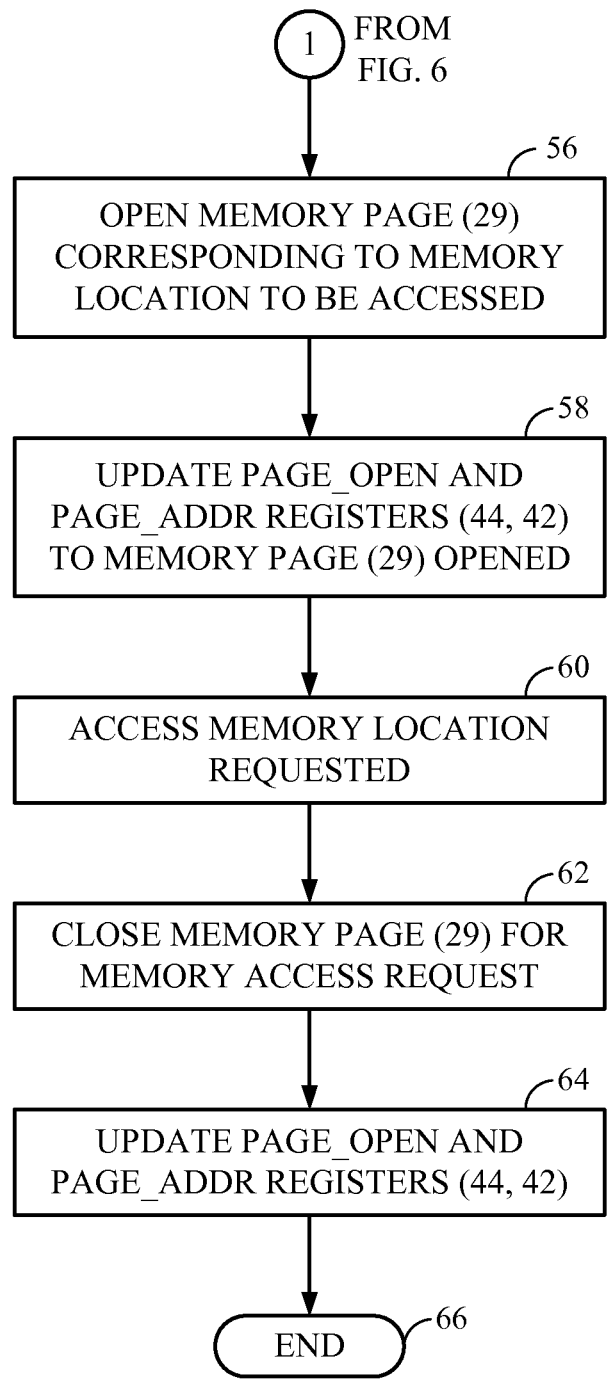

The memory controller 12 determines which memory bank 28 and memory page 29 within the memory bank 28 corresponds to the received memory address in the memory access request (block 52). This is so the memory controller 12 can enable the correct chip select (CS) for the DDR DRAM memory chip 14A, 14B containing the desired memory location of the memory request. The memory controller 12 also uses this information to activate the correct memory page 29 and column in the DDR DRAM memory chip 14A, 14B corresponding to the memory location to be accessed. The memory controller 12 then determines if the memory access configuration provided for memory bank 28 containing the memory location to be accessed is for its memory page 29 is to be left open or closed after each access (decision 54). The memory controller 12 consults the BANK_OPEN_PAGE_EN register 46 in this regard. If to be closed after each access, this means the memory page 29 corresponding to the memory location is first opened before the memory location in the memory page 29 can be accessed. In this regard, as illustrated in FIG. 7, the memory controller 12 opens the memory page 29 corresponding to the memory location to be accessed (block 56). The PAGE_OPEN and PAGE-ADDR registers 44, 42 are updated to indicate the currently open memory page 29 accordingly (block 58). The memory controller 12 then directly accesses the memory location requested from the memory page 29 opened (block 60). The memory controller 12 then closes the currently open memory page 29 for the accessed memory location (block 62). The PAGE_OPEN and PAGE_ADDR registers 44, 42 are again updated to indicate that the memory page 29 is no longer open (block 64). The memory access request process then ends for this particular memory access request (block 66). One or more other memory access requests may be continuing to execute in a pipeline of the memory controller 12.

If, however, the memory controller 12 determined that a memory access configuration is provided for the memory bank 28 containing the memory location to be accessed to be left open after each access (via the BANK_OPEN_PAGE_EN register 46) (decision 54), the memory controller 12 may be able to directly access the memory location desired without having to first open the memory page 29 containing the memory location. This would result in a memory access time savings. In this regard, as illustrated in FIG. 6, the memory controller 12 determines if the memory page 29 corresponding to the memory location to be accessed is already opened (decision 68). The PAGE_ADDR and PAGE_OPEN registers 42, 44 are consulted in this regard. If the memory page 29 corresponding to the memory location to be accessed is already opened, the memory controller 12 directly accesses the memory location requested without closing the memory page 29 thereafter (block 70), and the memory access request ends (block 72). The PAGE_OPEN and PAGE-ADDR registers 44, 42 are not updated since the memory page 29 accessed remains open.

The memory access is made by the memory controller 12 in less clock cycles that would otherwise be required, because the memory controller 12 did not have to first open the memory page 29 containing the memory location to be accessed before accessing the memory location in this instance. Thus, in this example, contiguous memory accesses to the same memory page 29 will result in memory access time savings, because the memory controller 12 will not have to first open the memory page 29 before the memory location can be accessed. As an example, if opening a memory page 29 requires clock cycles for the memory controller 12, a three clock cycle access time savings can be realized between contiguous memory accesses to the same memory page 29. Memory access time savings and penalties that may be realized for memory accesses employed by the memory system 10 were previously discussed and illustrated by example in FIGS. 2 and 3.

If the memory controller 12 determines that the memory page 29 corresponding to the memory location to be accessed is not already opened (decision 68), another memory page 29 not corresponding to the memory location to be accessed may be currently open. The PAGE_ADDR and PAGE_OPEN registers 42, 44 are consulted in this regard. If so, the memory controller 12 must first close the currently opened memory page 29 in the memory bank 28 (block 74), before the new memory page 29 corresponding to the memory location to be accessed can be opened (block 76). The PAGE_ADDR and PAGE_OPEN registers 42, 44 are updated to store the newly opened memory page 29 (block 78). The memory controller 12 can then directly access the memory location to be accessed (block 70). In this example, two contiguous memory access requests were made to different memory pages 29 in the same memory bank 28. Memory access time is increased, because the memory controller 12 must expend processing time and clock cycles closing a previously opened memory page 29 and then opening the new memory page 29 corresponding to the memory location to be accessed. As an example, if closing a memory page 29 take three clock cycles, and opening a memory page 29 takes three clock cycles, a three clock cycle access time penalty is realized between contiguous memory accesses to the different memory pages 29.

In another embodiment, the memory controller 12 is configured to have the ability to dynamically change or override a memory access configuration for a given memory bank 28 to further optimize memory access times. The memory controller 12 can be configured to allow for dynamic configuration of the memory banks 28 during run-time. Dynamic configuration involves changing the memory access configuration for a particular memory bank 28 to further optimize memory access times. As will be discussed in more detail below, the memory controller 12 may decide to either change or override a memory access configuration for a particular memory bank 28 based on upcoming pending memory access requests in a memory access request queue of the memory controller 12. For example, if the next scheduled memory access request to a given memory bank 28 is to a memory page 29 that is different from the memory page 29 currently being accessed by the memory controller 12 in the same memory bank 28, the memory controller 12 could dynamically recognize this condition. In response, the memory controller 12 could dynamically close the currently accessed memory page 29 instead of leaving it open after access. In this manner, the memory controller 12 would not be required to later close the currently accessed memory page 29 when the memory access request to a different memory page 29 to the same memory bank 28 is processed. By dynamic, it is meant that the memory controller 12 is configured to recognize and override or change a memory access configuration in run-time based on either actual or predicted future memory accesses requests. The memory controller 12 may close the currently accessed memory page 29 without changing the memory access configuration for the memory bank 29, which would be an override. Alternatively, the memory controller 12 may close the currently accessed memory page 29 and change the memory access configuration for the memory bank 29 by changing the bit assigned to the memory bank 29 in the memory access configuration register (e.g., the BANK_PAGE_OPEN_EN register 46)

Figure 8:
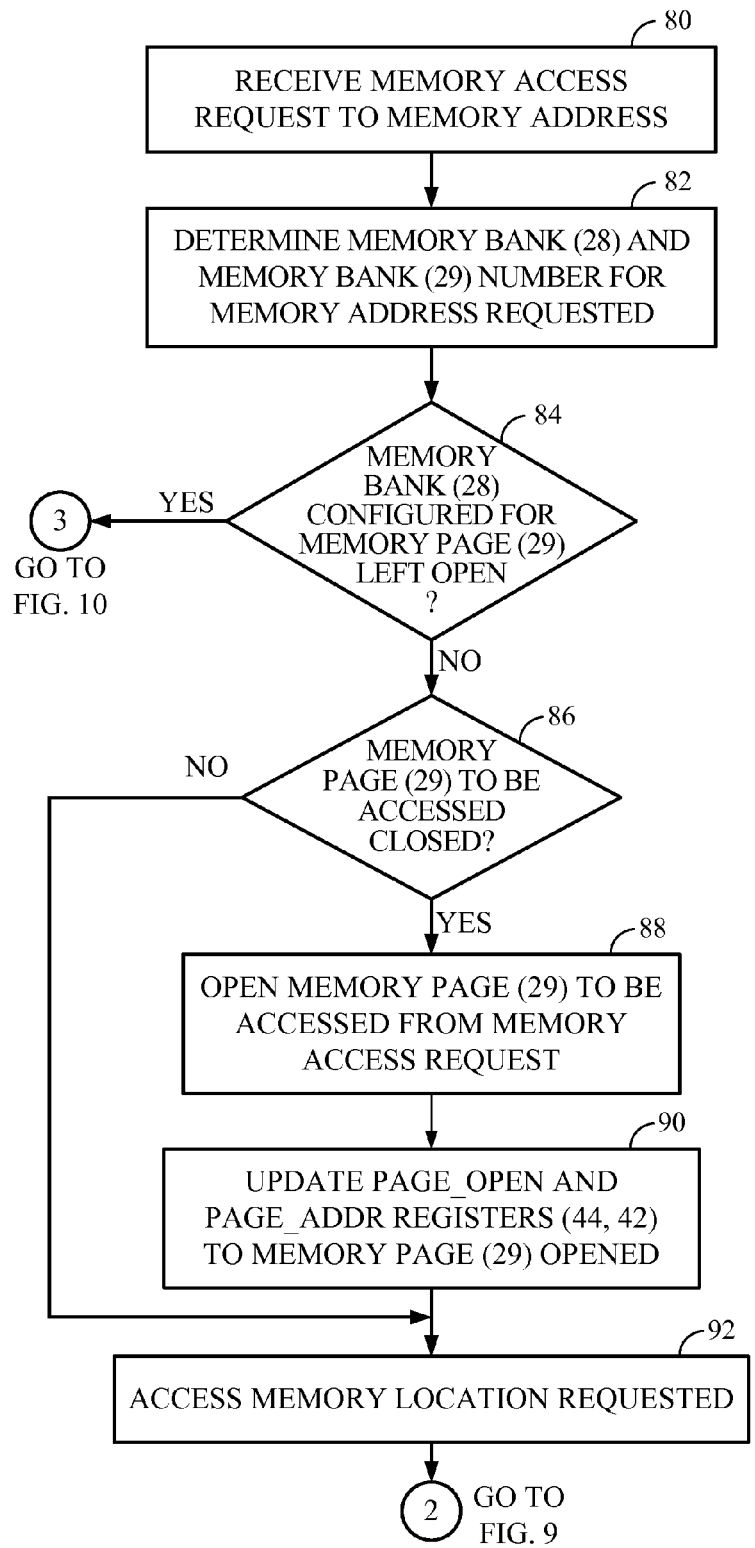
FIGS. 8-10 are flowcharts illustrating another exemplary process for accessing data in a memory page of a memory bank wherein a dynamic memory access configuration can be provided for the memory bank.
Figure 9:
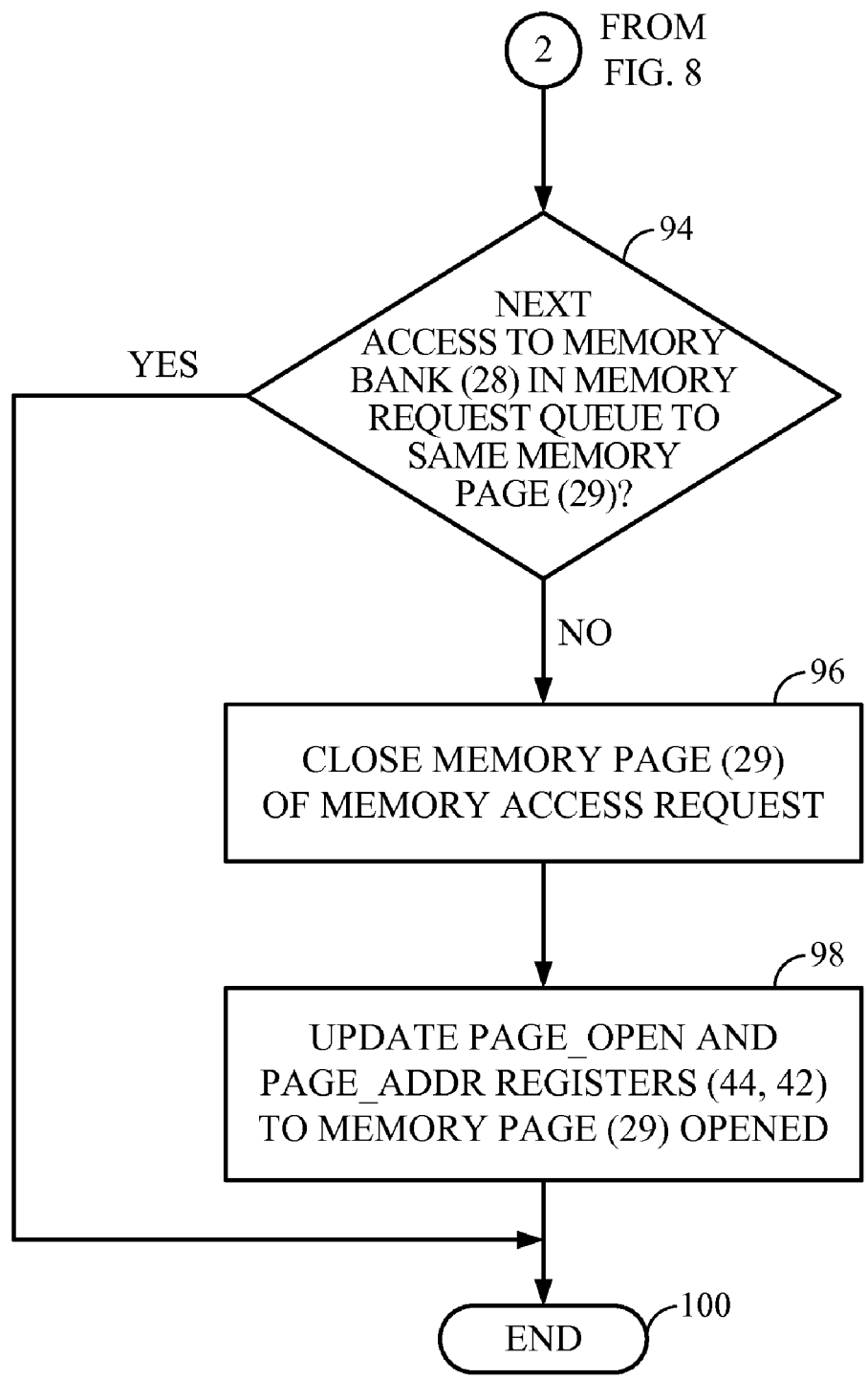
Figure 10:
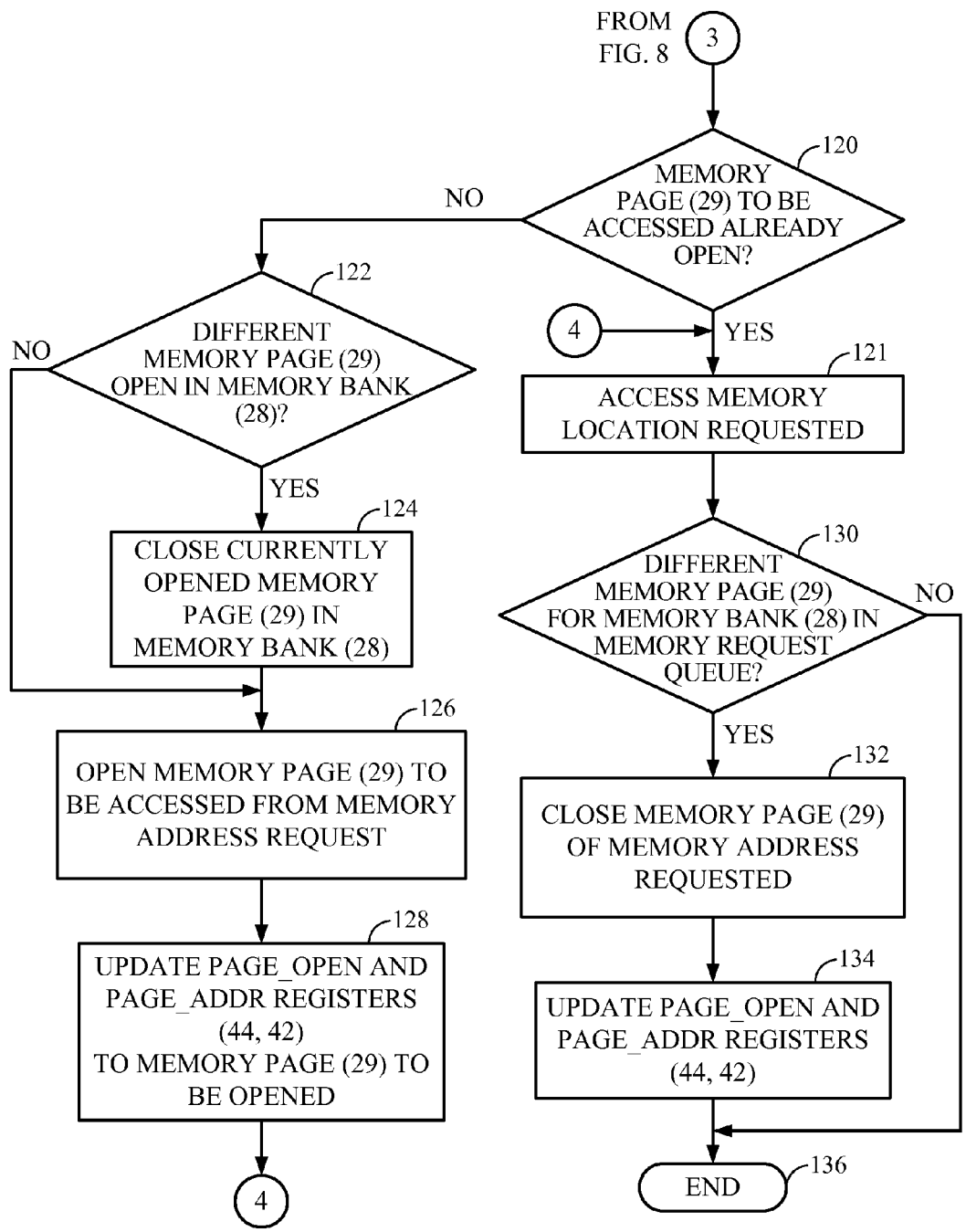

Turning to the flowcharts of FIGS. 8-10, an exemplary memory access process performed by the memory controller 12 is illustrated that includes dynamic memory access configuration capabilities. The memory controller 12 receives a memory access request from the system bus 31 and processes the request based on a static memory access configuration provided for the memory bank 28 corresponding to the memory location of the request, just as provided in blocks 50-54 of FIG. 6 (blocks 80-84). If the memory bank 28 containing the memory address requested is configured for its memory pages 29 to be closed after access (decision 84), the process next determines if the memory page 29 to be accessed is currently closed (decision 86). The PAGE_ADDR and PAGE_OPEN registers 42, 44 are consulted in this manner. This is because as further discussed below, the memory access configuration for the memory page 29 to be accessed may have previously been left open due to an override of the memory access configuration. If the memory page 29 to be accessed is closed, the memory page 29 is first opened before being accessed (block 88). The PAGE_OPEN and PAGE_ADDR registers 44, 42 are updated to indicate that the memory page 29 is currently open (block 90). The memory location is then accessed (block 92).

Figure 11:
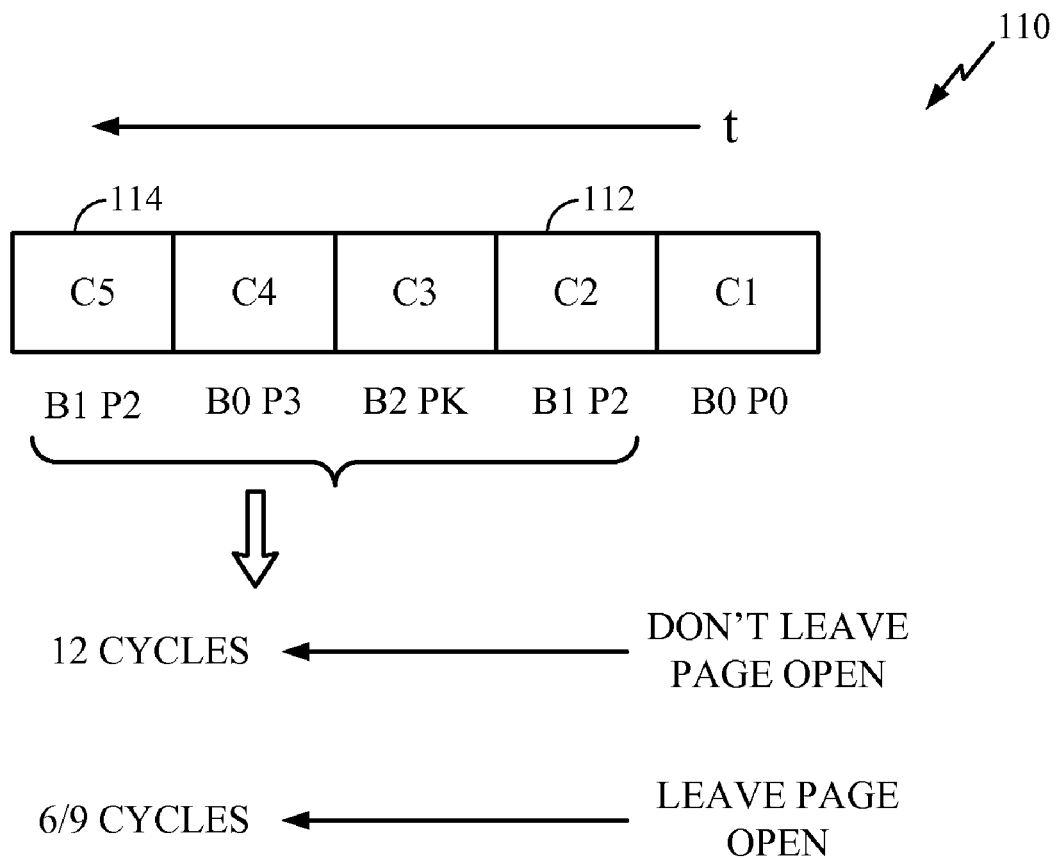
FIGS. 11 and 12 are diagrams of exemplary memory request queues for the memory controller.

The memory controller 12 can perform dynamic memory access configuration based on pending or future memory access requests. In one embodiment, before closing the memory page 29, the memory controller 12 first determines if the next scheduled access to the same memory bank 28 is to the same memory page 29 currently open (FIG. 9, decision 94). If so, further memory access time savings can be realized by overriding the memory access configuration by leaving open the memory page 29 instead of closing the memory page 29, thus ending the process (block 100). An example is provided in the memory request queue 110 in FIG. 11. As illustrated therein, assume the memory controller 12 is currently accessing a memory location in memory bank 1, memory page 2 in memory request "C2" 112. Before the memory controller 12 closes memory page 2, the memory controller 12 first reviews the memory request queue 110 to determine if the next access to memory bank 1 is to the same or different memory page 29 (FIG. 9, decision 94). In the example of the memory request queue 110 of FIG. 11, the next access to memory page 1 is to the same memory page 2 as provided in memory access request "C5" 114. Thus, in this case, the memory controller 12 dynamically overrides the close page after memory access configuration for the accessed memory page 29 by leaving the memory page 29 open, thus ending the process (block 100). As a result, either six (6) or nine (9) clock cycles are incurred depending on whether the memory page 29 is left open or closed, respectively, after the second access in memory access request "C5" 114 as opposed to twelve (12) clock cycles if the memory page 29 were closed (e.g., after memory access request "C2" 112 in FIG. 11) and then reopened and closed again on the subsequent access (e.g., for memory access request "C5" 114 in FIG. 11). If the next access to the same memory bank 28 were not to the same memory page 29, the memory controller 12 follows the static memory access configuration by closing the memory page 29 after access (FIG. 9, block 96), and updating the PAGE_OPEN and PAGE_ADDR registers 44, 42, accordingly (FIG. 9, block 98)

Turning back to FIG. 8, if the memory bank 28 containing the memory page 29 to be accessed has a memory access configuration for memory pages to be left open after each access (decision 84), before the memory page 29 is accessed, as illustrated in FIG. 10, the memory controller 12 determines if the memory page 29 to be accessed is already open (decision 120). If so, the memory location can be requested without first having to open the memory page 29 (block 121). In this regard, the memory controller 12 determines if a different memory page 29 in the memory bank 28 is open (decision 122). If not, this means that the memory controller 12 previously overrode the leave open page memory access configuration for the memory bank 28 to be accessed during a preceding memory access request as will be discussed in more detail below. If a different memory page 29 in the memory bank 28 is open (decision 122), the memory page 29 currently opened is closed (block 124). Thereafter, the memory page 29 to be accessed is opened (block 126), and the PAGE_OPEN and PAGE_ADDR registers 44, 42 are updated accordingly (block 128). The memory location is then requested after the memory page 29 is opened (block 121).

After the memory location requested is accessed (block 121), the memory controller 12 determines if the leave page open memory access configuration for the memory bank 28 having the memory page 29 accessed should be overridden. If the next memory access request to the same memory bank 28 is to a different memory page 29, the memory controller 12 can save further clock cycles by overriding the leave page open configuration to close the accessed memory page 29 instead of leaving it open. Otherwise, the memory controller 12 will have to first close the accessed memory page 29 before opening a subsequent different memory page 29 in the same memory bank 28. The memory controller 12 reviews the memory request queue 140 to determine if there are future, pending memory access requests to the same memory bank 28, but to a different memory page 29 (decision 130). If so, the memory controller 12 dynamically overrides the leave page open memory access configuration for the accessed memory bank 28 and closes the currently accessed memory pages 29 after access (block 132), and the PAGE_OPEN and PAGE_ADDR registers 44, 42 are updated accordingly (block 134). If not, the currently accessed memory page 29 is left open and the process ends (block 136). This is further illustrated in the example of FIG. 12, discussed below.

Figure 12:
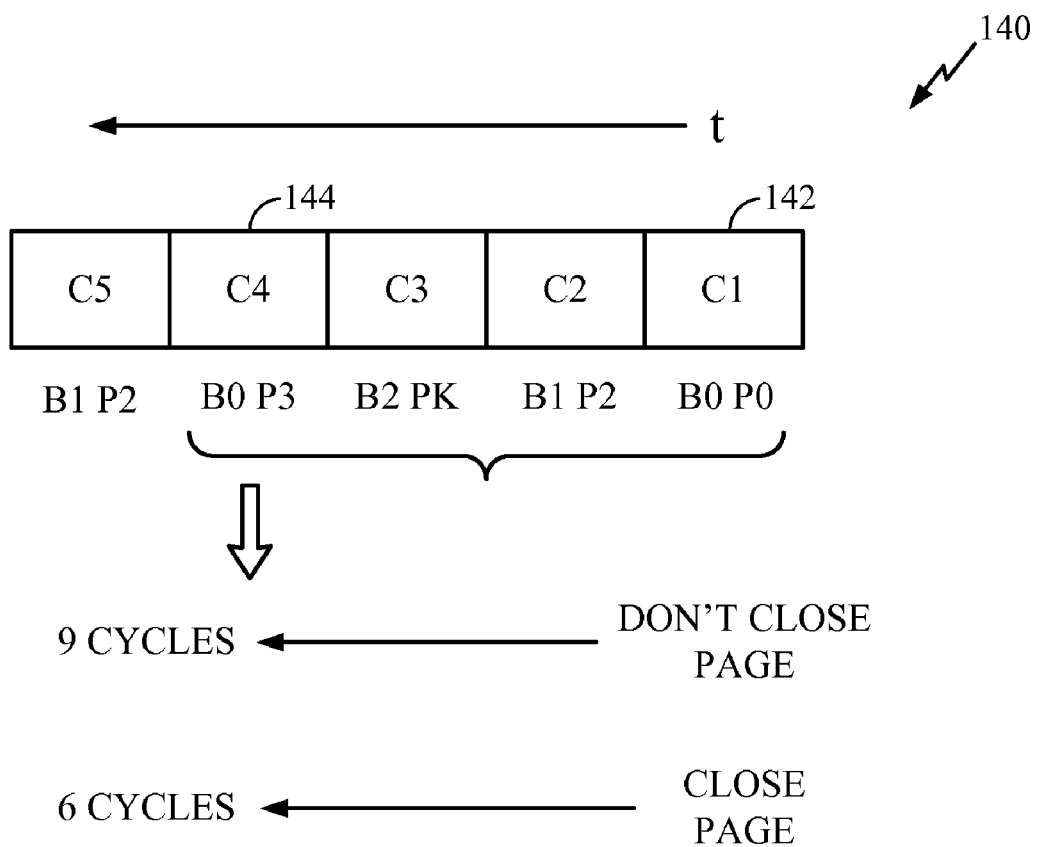

As illustrated in FIG. 12, a memory page 0 in memory bank 0 is currently being accessed by the memory controller 12, as illustrated in queue location "C1" 142. The next known memory access request to memory bank 0 is to memory page 3, as shown in queue location "C4" 144. Thus, because there is a next, pending memory access request to a different memory page 29 in the same memory bank 28, the memory controller 12 closes the currently accessed memory page 29 (i.e., memory page 0 in memory bank 0) after access instead of leaving it open (FIG. 10, block 132). This incurs six (6) clock cycles instead of three (3) clock cycles in this example. However, if memory page 0 in memory bank 0 were not closed by a dynamic memory access configuration override, nine (9) clock cycles will be incurred in this example when memory page 3 in memory bank 0 is accessed.

Figure 13:
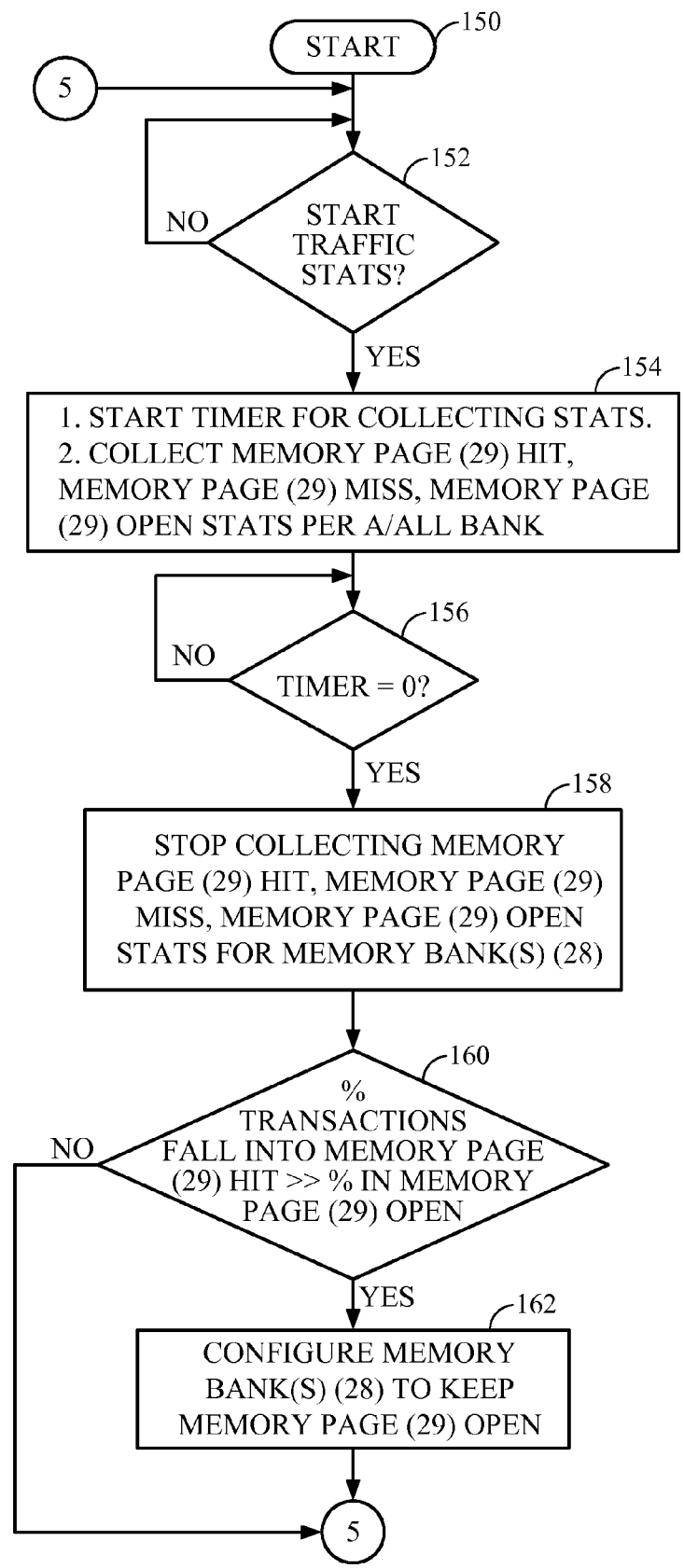
FIG. 13 is a flowchart illustrating another exemplary process for accessing data in a memory page of a memory bank wherein a predictive-based dynamic memory access configuration can be provided for the memory bank.

The memory controller 12 may be configured to provide dynamic memory access configuration based on a predictive analysis instead of a review of a memory request queue. By predictive analysis, the memory controller 12 performs a review of memory access requests to memory banks 28 and their memory pages 29 to predict future accesses for determining whether a memory access configuration should be overridden. Any method of predicting future memory access can be employed. The flowchart in FIG. 13 illustrates one example for memory banks 28 configured for their memory pages 29 to be closed after access. As illustrated therein, the process starts (block 150) and the memory controller 12 or another circuit or controller accessible by the memory controller 12 starts collecting traffic statistics for memory access requests (block 152). This process can be initiated by a command or enabled via programming of the memory controller 12. A countdown timer is started and memory page 29 hits, memory page 29 misses, and memory page 29 opens are collected for either some or all memory banks 28 that are configured to keep memory pages 29 open after access (block 154). The countdown timer can be set to any starting count desired. After the countdown timer reaches zero (decision 156), the collecting of statistics regarding memory page 29 hits, memory page 29 misses, and memory page 29 opens for each memory bank 28 are halted (block 158). A memory page 29 miss is when a memory access request is made to a different memory page 29 in a given memory bank 28 from an immediately prior memory access request to the given memory bank 28. In this case, closing the memory page 29 after the immediate prior memory access request resulted in a net memory access time savings. A memory page 29 hit is when a memory access request to a given memory bank 28 is to the same memory page 29 as an immediately prior memory access request to the given memory bank 28. In this case, keeping the memory page 29 open would have resulted in memory access time savings.

If the percentage of memory access transactions resulting in a memory page 29 hit is greater by a certain threshold amount than the percentage of memory access transactions resulting in a memory page 29 open for a given memory bank 28 (decision 160), the memory access configuration for that given memory bank 28 is configured to keep its memory pages 29 open after access (block 162). In other words, the history of memory access requests to the given memory bank 28 is used to predict future access to the given memory bank 28 and whether a configuration of keeping memory pages 29 open for the given memory bank 28 will likely result in a net memory access time savings. If the percentage of memory access transactions resulting in a memory page 29 hit is not greater by a certain threshold amount than the percentage of the percentage of memory access transactions resulting in a memory page 29 open for a given memory bank 28 (decision 160), the close memory page 29 after access configuration for the given memory bank 28 is not changed.

Alternatively, or in addition, for memory banks 28 that are configured to keep memory pages 29 open after access, the memory controller 12 can perform a similar analysis to determine if the memory access configuration for a memory bank 28 should be overridden to close memory pages 29 after access. In this regard, the process involves the same processes 150-158. However, the percentage of memory access traffic that results in a memory page 29 miss being greater than the percentage of memory page 29 hits for a given memory bank 28 is determined. If the percentage of memory access traffic that results in a memory page 29 miss is greater, the memory controller 12 changes the memory access configuration for the given memory bank 28 to close memory pages 29 after access (as a replacement for block 162). If not, the keep memory page 29 open after access configuration for the given memory bank 28 is not changed. Again, a prediction is being made as to whether a net memory access time savings will likely result in changing a keep memory page 29 open access configuration to a close memory page 29 after access configuration.

Figure 14:
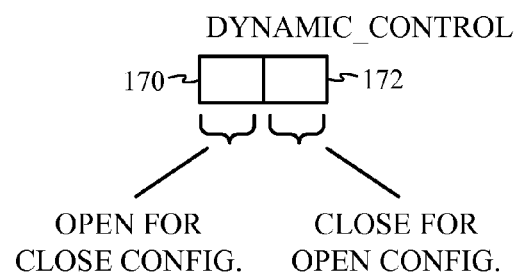
FIG. 14 is a diagram of exemplary internal registers provided in the memory controller for enabling or disabling dynamic memory access configuration.

It may be desired to provide a memory controller 12 that can be programmed to either allow (i.e., enable) or not allow (i.e., disable) dynamic memory access configuration. In this regard, FIG. 14 illustrates exemplary internal dynamic memory access configuration registers labeled "DYNAMIC_CONTROL" that may be provided in the memory controller 12 to either enable or disable dynamic memory access configuration. In this regard, two registers 170, 172 are provided. The first register 170 is provided and set if it is desired to allow the memory controller 12 to override a normal close memory page 29 after access configuration to keep a memory page 29 open after an access (see, e.g., FIG. 9). The second register 172 is provided and set if it is desired to allow the memory controller 12 to override a normal keep memory page 29 open after access configuration to close a memory page 29 after an access (see, e.g., FIG. 10). The registers 170, 172 are set to control dynamic memory access configuration for all memory banks 28 accessible by the memory controller 12. By providing separate registers 170, 172 for dynamic memory access configuration for normally keep page open and close memory page configurations, the memory controller 12 can be programmed to allow dynamic memory access configuration for both cases, one of these cases, or neither. Further, if it is not desired to not allow programming of dynamic memory access configuration, the bits of the DYNAMIC_CONTROL registers 170, 172 can be hard coded to the desired setting.

Figure 15:
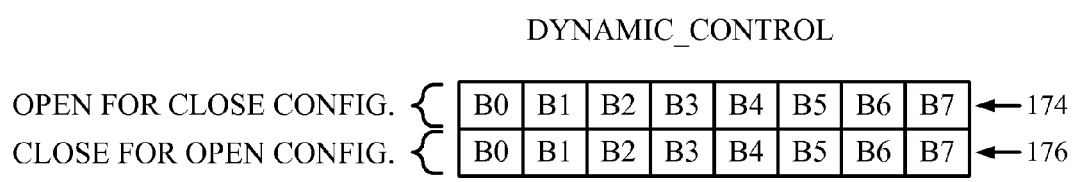
FIG. 15 is a diagram of exemplary internal registers provided in the memory controller for enabling or disabling dynamic memory access configuration on a memory bank basis.

FIG. 15 illustrates exemplary internal dynamic memory access configuration registers labeled "DYNAMIC_CONTROL" that allow for dynamic memory access configuration to be provided for each memory bank 28 individually instead of for all memory banks 28 equally. In this regard, two registers 174, 176 are provided, each having a bit for each memory bank 28 accessible by the memory controller 12. In this example, each register 174, 176 has eight bits since there are eight memory banks 28 accessible by the memory controller 12. The first register 174 is provided and set if it is desired to allow the memory controller 12 to override a normal close memory page 29 after access configuration to keep a memory page 29 open after an access (see, e.g., FIG. 9). The second register 176 is provided and set if it is desired to allow the memory controller 12 to override a normal keep memory page 29 open after access configuration to close a memory page 29 after an access (see, e.g., FIG. 10). The registers 174, 176 are set for each memory bank 28 to control dynamic memory access configuration accessible by the memory controller 12. By providing bits for each memory bank 28, the memory controller 12 can be controlled to allow or not allow dynamic memory access configuration for each memory bank 28 on an individual basis. Further, if it is not desired to not allow programming of dynamic memory access configuration, the bits of the DYNAMIC_CONTROL registers 174, 176 can be hard coded to the desired setting.

Figure 16:
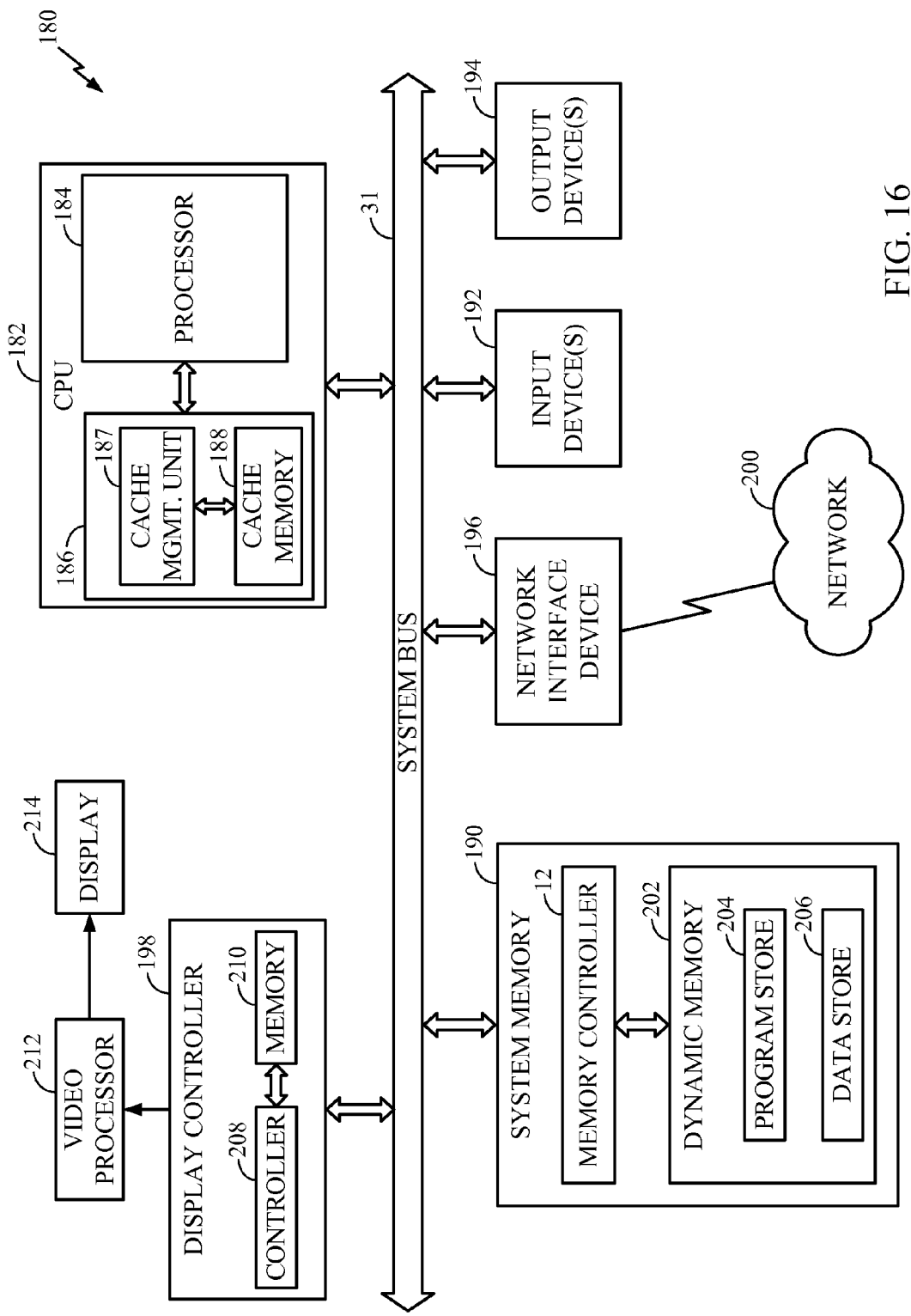
FIG. 16 is a block diagram of an exemplary processor-based system which includes the memory controller of FIG. 1 configured to provide a memory access configuration for each memory bank provided in a system memory.

FIG. 16 illustrates a processor-based system 180 that may employ the memory controller 12 and the memory access configuration aspects described above. The processor-based system 180 includes a central processing unit (CPU) 182 that includes a microprocessor 184 and an integrated cache system 186 to the CPU 182. The cache system 186 includes a cache management unit 187 that controls access to a cache memory 188 accessible to the microprocessor 184 for rapid access to temporary storage for frequently accessed data. The CPU 182 is coupled to the system bus 31, which interconnects the other devices included in the processor-based system 180. As is well known, the CPU 182 communicates with these other devices by exchanging address, control, and data information over the system bus 31. These devices may include any types of devices. As illustrated in FIG. 16, these devices may include system memory 190, one or more input devices 192, one or more output devices 194, a network interface device 196, and a display controller 198, as examples.

The input devices 192 may include any type of input device, including but not limited to input keys, switches, voice processors, etc. The output devices 194 may include any type of output device, including but not limited to audio, video, other visual indicators, etc. The network interface device 196 may be any device configured to allow exchange of data to and from a network 200. The network 200 may be any type of network, including but not limited to a wired or wireless network, private or public network, a local area network (LAN), a wide area network (WLAN), and the Internet. The network interface device 196 may support any type of communication protocol desired.

The CPU 182 may also access the system memory 190 over the system bus 31. The system memory 190 may include a memory controller 12, like that previously described and illustrated in FIG. 1, to interface and control access to the system memory 190. The system memory 190 may include a dynamic memory 202. As previously discussed, dynamic memory 202 may be provided for the system memory 190 in lieu of or in addition to static memory. The dynamic memory 202 may include a program store 204 and a data store 206 for the CPU 182. The dynamic memory 202 may be comprised of the DDR DRAM memory 14 previously described and illustrated in FIG. 1.

The CPU 182 may also access the display controller 198 over the system bus 31 to control information sent to a display 214. The display controller 198 may include a memory controller 208 and memory 210 to store data to be sent to the display 214 in response to communications with the CPU 182. The memory controller 208 and memory 210 may include a memory controller and dynamic memory, like the memory controller 12 and DDR DRAM memory 14 previously described and illustrated in FIG. 1. The display controller 198 sends information to the display 214 to be displayed via a video processor 212, which processes the information to be displayed into a format suitable for the display 214. The display 214 may include any type of display, including but not limited to a cathode ray tube (CRT), a liquid crystal display (LCD), a plasma display, etc.

A memory controller according to embodiments disclosed herein may be provided in or integrated in a semiconductor die, integrated circuit, processor-based device for controlling access to memory, or any other device, including an electronic device. Examples of electronic devices, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

It is noted that the operational tasks described in any of the exemplary embodiments herein are described to provide examples and discussion. The operations described may be performed in numerous different sequences other than the illustrated sequences. Furthermore, operations described in a single operational task may actually be performed in a number of different tasks. Additionally, one or more operational tasks discussed in the exemplary embodiments may be combined. It is to be understood that the operational tasks illustrated in the flow chart diagrams may be subject to numerous different modifications as will be readily apparent to one of skill in the art. Those of skill in the art would also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm tasks described in connection with the embodiments disclosed herein may be implemented as electronic hardware, computer software, or combinations of both. To clearly illustrate this interchangeability of hardware and software, various illustrative components, blocks, modules, circuits, and tasks have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The tasks of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A memory controller, comprising:
   a controller configured to access at least one memory location corresponding to at least one memory page in at least one of a plurality of memory banks according to a memory access configuration provided for each of the plurality of memory banks;
   one or more static memory access configuration registers configured to store the memory access configuration, the memory access configuration indicating whether each memory bank of the plurality of memory banks is to be left open or to be closed after a memory access to the memory bank;
   one or more dynamic memory access configuration registers configured to store override information indicating whether the controller is enabled to override the memory access configuration,
   wherein the controller is configured to either close or leave open the at least one memory page based on at least one of the memory access configuration stored in the one or more static memory access configuration registers and the override information stored in the one or more dynamic memory access configuration registers.

2. The memory controller of claim 1, wherein the memory access configuration comprises at least one leave open memory page configuration and at least one close memory page configuration.

3. The memory controller of claim 1, wherein the controller is further configured to determine if the memory access configuration for a memory bank among the plurality of memory banks indicates to leave open the at least one memory page.

4. The memory controller of claim 3, wherein the controller is further configured to open the at least one memory page in the memory bank if the memory access configuration for the memory bank indicates to close the at least one memory page.

5. The memory controller of claim 3, wherein the controller is further configured to determine if the at least one memory page in the memory bank is opened.

6. The memory controller of claim 5, wherein the controller is further configured to access the at least one memory page without first opening the memory page if the controller determines the at least one memory page is already opened.

7. The memory controller of claim 5, wherein the controller is further configured to close a previously opened memory page if the controller determines the at least one memory page is not opened.

8. The memory controller of claim 1, wherein the controller is further configured to determine if the memory access configuration for a memory bank among the plurality of memory banks should be dynamically changed.

9. The memory controller of claim 8, wherein the controller is configured to determine if the memory access configuration for the memory bank should be dynamically changed as a function of one or more memory access requests.

10. The memory controller of claim 8, wherein the controller is configured to determine if the memory access configuration for the memory bank should be dynamically changed as a function of a prediction of memory access requests.

11. The memory controller of claim 1 integrated in at least one semiconductor die.

12. The memory controller of claim 1, further comprising a device, selected from the group consisting of a set top box, an entertainment unit, a navigation, device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player, into which the controller is integrated.

13. The memory controller of claim 1, further comprising:
   a first dynamic memory access configuration register indicating whether the controller is enabled to override a leave open memory page configuration for any of the plurality of memory banks; and
   a second dynamic memory access configuration register indicating whether the controller is enabled to override a close memory page configuration for any of the plurality of memory banks.

14. The memory controller of claim 1, further comprising:
   a first plurality of dynamic memory access configuration registers, wherein each of the first plurality of dynamic memory access configuration registers indicates whether the controller is enabled to override a leave open memory page configuration for a corresponding memory bank; and
   a second plurality of dynamic memory access configuration registers, wherein each the second plurality of dynamic memory access configuration registers indicates whether the controller is enabled to override a close memory page configuration for a corresponding memory bank.

15. A method of accessing memory in a memory system, comprising:
   receiving a memory access request comprising a memory address at a memory controller;
   accessing one or more static memory access configuration registers storing a memory access configuration for each of a plurality of memory banks, wherein the memory access configuration indicates whether each memory bank of the plurality of memory banks is to be left open or to be closed after a memory access to the memory bank and wherein each memory bank contains at least one memory page;
   determining if the memory access configuration for a memory bank that contains the memory address is configured to close or leave open a memory page;
   determining whether to dynamically change the memory access configuration by accessing one or more dynamic memory access configuration registers storing override information indicating whether the memory controller is enabled to override the memory access configuration; and
   closing or leaving open the memory page in the memory bank containing the memory address based on at least one of the memory access configuration stored in the one or more static memo access configuration registers and the override information stored in the one or more dynamic memory access configuration registers.

16. The method of claim 15, further comprising determining if the memory access configuration for the memory bank is configured to close or leave open its memory pages after access.

17. The method of claim 16, further comprising determining if the memory page is opened before accessing the memory page.

18. The method of claim 17, further comprising accessing the memory page without first opening the memory page if the memory page is opened.

19. The method of claim 17, further comprising closing a previously opened memory page if the memory page containing the memory address is not opened.

20. The method of claim 15, further comprising accessing the memory page to access data stored at the memory address.

21. The method of claim 20, further comprising opening the memory page before accessing the memory page if the memory access configuration for the memory bank is configured to close the memory page.

22. The method of claim 15, wherein the override information indicates whether the memory controller is enabled to override a leave open memory page configuration for the memory bank or whether the memory controller is enabled to override a close memory page configuration for the memory bank.

23. The method of claim 22, further comprising dynamically changing the memory access configuration for the memory bank containing the memory address by either temporarily overriding the memory access configuration based on the override information stored in the one or more dynamic memory access configuration registers or storing a new configuration for the memory access configuration.

24. The method of claim 22, further comprising:
reviewing one or more pending memory access requests; and
dynamically changing the memory access configuration based on the one or more pending memory access requests.

25. The method of claim 22, further comprising:
predicting future memory access requests to the memory bank; and
dynamically changing the memory access configuration of the memory bank based on the predicted future memory access requests to the memory bank.

26. A memory system, comprising:
a plurality of memory banks each containing at least one memory page;
a memory controller configured to access at least one memory location corresponding to the at least one memory page in at least one of the plurality of memory banks according to a memory access configuration provided for each of the plurality of memory banks;
one or more static memory access configuration registers configured to store the memory access configuration, the memory access configuration indicating whether each memory bank of the plurality of memory banks is to be left open or to be closed after a memory access to the memory bank; and
one or more dynamic memory access configuration registers configured to store override information indicating whether the memory controller is enabled to override the memory access configuration,
wherein the memory controller is configured to either close or leave open the at least one memory page based on at least one of the memory access configuration stored in the one or more static memory access configuration registers and the override information stored in the one or more dynamic memory access configuration registers.

27. The memory system of claim 26, wherein the memory access configuration comprises at least one leave open memory page configuration and at least one close memory page configuration.

28. The memory system of claim 26, wherein the memory controller is further configured to determine if the memory access configuration for a memory bank among the plurality of memory banks indicates to leave open the at least one memory page.

29. The memory system of claim 26, wherein the memory controller is further configured to determine if the memory access configuration for a memory bank among the plurality of memory banks should be dynamically changed.

30. The memory system of claim 29, wherein the memory controller is further configured to dynamically change the memory access configuration for the memory bank.

31. The memory system of claim 26 integrated in at least one semiconductor die.

32. A memory controller, comprising:
a controller configured to access at least one memory location corresponding to at least one memory page in at least one of a plurality of memory banks according to a memory access configuration provided for each of the plurality of memory banks;
means for storing the memory access configuration, the memory access configuration indicating whether each memory bank of the plurality of memory banks is to be left open or to be closed after a memory access to the memory bank;
means for storing override information, the override information indicating whether the controller is enabled to override the memory access configuration,
wherein the controller is configured to either close or leave open the at least one memory page based on at least one of the memory access configuration stored in the means for storing the memory access configuration and the override information stored in the means for storing override information.

33. A method of accessing memory in a memory system, comprising:
step for receiving a memory access request comprising a memory address at a memory controller;
step for accessing one or more static memory access configuration registers storing a memory access configuration for each of a plurality of memory banks, wherein the memory access configuration indicates whether each memory bank of the plurality of memory banks is to be left open or to be closed after a memory access to the memory bank and wherein each memory bank contains at least one memory page;
step for determining if the memory access configuration for the memory bank is configured to close or leave open the at least one memory page;
step for determining whether to dynamically change the memory access configuration by accessing one or more dynamic memory access configuration registers storing override information indicating whether the memory controller is enabled to override the memory access configuration;
step for closing or leaving open the at least one memory page in the memory bank containing the memory address based on at least one of the memory access configuration stored in the one or more static memory access configuration registers and the override information stored in the one or more dynamic memory access configuration registers.

34. A non-transitory computer-readable medium including program code that, when executed by a processor, causes the processor to:
receive a memory access request comprising a memory address;
access one or more static memory access configuration registers storing a memory access configuration for each of a plurality of memory banks, wherein the memory access configuration indicates whether each memory bank of the plurality of memory banks is to be left open or to be closed after a memory access to the memory bank and wherein each memory bank contains at least one memory page;

determine if a memory access configuration for a memory bank containing the memory address is configured to close or to leave open the at least one memory page;

determine whether to dynamically change the memory access configuration by accessing one or more dynamic memory access configuration registers storing override information indicating whether the processor is enabled to override the memory access configuration; and close or leave open the at least one memory page in the memory bank containing the memory address based on at least one of the memory access configuration stored in the one or more static memory access configuration registers and the override information stored in the one or more dynamic memory access configuration registers.

* * * * *